(12) United States Patent
Boybat Kara et al.

(10) Patent No.: US 11,348,002 B2
(45) Date of Patent: May 31, 2022

(54) TRAINING OF ARTIFICIAL NEURAL NETWORKS

(71) Applicant: International Business Machines Corporation, Armonk, NY (US)

(72) Inventors: Irem Boybat Kara, Zurich (CH); Evangelos Stavros Eleftheriou, Rueschlikon (CH); Manuel Le Gallo-Bourdeau, Zurich (CH); Nandakumar Sasidharan Rajalekshmi, Thalwil (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 965 days.

(21) Appl. No.: 16/022,950

(22) Filed: Jun. 29, 2018

(65) Prior Publication Data

US 2019/0122105 A1  Apr. 25, 2019

Related U.S. Application Data

(60) Provisional application No. 62/576,081, filed on Oct. 24, 2017.

(51) Int. Cl.
*G06N 3/08* (2006.01)
*G11C 11/54* (2006.01)
*G11C 13/00* (2006.01)

(52) U.S. Cl.
CPC .............. *G06N 3/08* (2013.01); *G11C 11/54* (2013.01); *G11C 13/0004* (2013.01)

(58) Field of Classification Search
None
See application file for complete search history.

(56) References Cited

U.S. PATENT DOCUMENTS 9,418,331 B2   8/2016  Gupta
9,489,618 B2  11/2016  Roy et al.
(Continued)

FOREIGN PATENT DOCUMENTS

CN   103455843 A   12/2013
CN   105224986 A    1/2016
(Continued)

OTHER PUBLICATIONS

PCT/IP2018/058251, Written Opinion of the International Searching Authority and International Search Report, dated Feb. 12, 2019, pp. 1-11.
(Continued)

*Primary Examiner* — Benjamin P Sandvik
(74) *Attorney, Agent, or Firm* — Scully, Scott, Murphy & Presser, P.C.; Daniel P. Morris (57) ABSTRACT

Methods and apparatus are provided for training an artificial neural network having a succession of layers of neurons interposed with layers of synapses. A set of crossbar arrays of memristive devices, connected between row and column lines, implements the layers of synapses. Each memristive device stores a weight for a synapse interconnecting a respective pair of neurons in successive neuron layers. The training method includes performing forward propagation, backpropagation and weight-update operations of an iterative training scheme by applying input signals, associated with respective neurons, to row or column lines of the set of arrays to obtain output signals on the other of the row or column lines, and storing digital signal values corresponding to the input and output signals. The weight-update operation is performed by calculating digital weight-correction values for respective memristive devices, and applying programming signals to those devices to update the stored weights.

24 Claims, 8 Drawing Sheets

(56) References Cited

U.S. PATENT DOCUMENTS

| | | | |
|---|---|---|---|
| 9,646,243 B1 | 5/2017 | Gokmen | |
| 10,825,536 B1* | 11/2020 | Yang | G11C 17/16 |
| 11,074,318 B2* | 7/2021 | Ma | G06N 3/0445 |
| 2017/0011290 A1 | 1/2017 | Taha | |
| 2017/0017879 A1 | 1/2017 | Kataeva et al. | |
| 2017/0109626 A1 | 4/2017 | Gokmen | |
| 2020/0118001 A1* | 4/2020 | Boybat Kara | G06N 3/084 |
| 2020/0134461 A1* | 4/2020 | Chai | G06N 3/088 |
| 2020/0327406 A1* | 10/2020 | Piveteau | G11C 11/54 |

FOREIGN PATENT DOCUMENTS

| | | |
|---|---|---|
| CN | 106779059 A | 5/2017 |
| JP | 2002-117389 A | 4/2002 |

OTHER PUBLICATIONS

D. Negrova et al., An Approximate Backpropagation Learning Rule for Memristor Based Neural Networks Using Synaptic Plasticity, Jul. 2016, p. 17, URL:https://www.researchgate.net/publication/309742897_An_Approximate_Backpropagation_Learning_Rule_for_Memristor_Based_Neural_Networks_Using_Synaptic_Plasticity.

Manu V Nair et al., Gradient-Descent-Based Learning in Memristive Crossbar Arrays, IEEE 2015, p. 1, URL: http://personalpages.manchester.ac.uk/staff/p.dudek/papers/nair-ijcnn2015.pdf.

Fabien Alibart et al., Pattern Classification By Memristive Crossbar Circuits Using Ex Situ and In Situ Training, p. 5, 2013, URL:https://www.nature.com/articles/ncomms3072.pdf.

Burr, G.W., et al., "Experimental Demonstration and Tolerancing of a Large-Scale Neural Network (165 000 Synapses) Using Phase-Change Memory as the Synaptic Weight Element", IEEE Transactions on Electron Devices, Nov. 2015 pp. 3498-3507, vol. 62, No. 11.

Gokmen, T., et al., "Acceleration of Deep Neural Network Training with Resistive Cross-Point Devices: Design Considerations", Frontiers in Neuroscience, Jul. 2016, pp. 1-13, vol. 10, Article 333.

Notice of Reasons for Refusal dated Mar. 1, 2022 issued in Japanese Patent Application No. 2020-520136, 4 pages.

UK Examination Report dated Mar. 31, 2022 received in Application No. GB2006982.9, 2 pages.

* cited by examiner

Figure 17

TRAINING OF ARTIFICIAL NEURAL NETWORKS

CROSS-REFERENCE TO RELATED APPLICATIONS

This application claims the benefit of U.S. Provisional Patent Application No. 62/576,081 filed on Oct. 24, 2017, the complete disclosure of which is expressly incorporated herein by reference in its entirety for all purposes.

BACKGROUND

The present invention relates generally to training of artificial neural networks.

Artificial neural networks (ANNs) have been developed to perform computational tasks in a manner inspired by biological architectures of the nervous system. These networks are based on a principle of biological systems whereby neurons are interconnected via synapses which relay signals between the neurons. A biological neuron processes its input signals and generates output signals which are transmitted to other neurons via respective synapses. The strength of the signal transmitted by a synapse depends on conductance, also known as "synaptic efficacy" or "weight", of the synapse. Synaptic weight can be changed by neuronal activity, and this "plasticity" of synapses is crucial to memory and other brain functions. Artificial neural networks are based on a logical construction in which a succession of layers of neurons are interposed with layers of synapses, with each synapse interconnecting a respective pair of neurons in successive neuron layers. Signals relayed via synapses are weighted according to respective synaptic weights stored for the synapses. Weighted signals can thus be propagated over successive layers of the network from an input to an output neuron layer.

ANNs have been successfully applied in various complex analysis tasks such as speech and image recognition, e.g. classification of hand-written digits based on the MNIST (Modified National Institute of Standards and Technology) dataset. ANN operation involves a training phase in which the synaptic weights are determined. The network is exposed to a set of training data, e.g. image data for hand-written digits, in an iterative training scheme in which the weights are repeatedly updated as the network "learns" from the training data. In supervised learning of hand-written digits, for example, MNIST data for which the labels (here digit class from 0 to 9) are known is repeatedly supplied to the network. The output signals from the last neuron layer are compared to the expected network output for each digit to determine errors, and the weights are repeatedly updated to reduce the error until a convergence condition is reached. In particular, the steps of the iterative training process involve a forward propagation operation, a backpropagation operation, and a weight-update operation. In the forward propagation operation, signals derived from the training data are propagated from the input neuron layer to the output neuron layer. The resulting error signals are then propagated back through the network, from the output to the input neuron layer, in the backpropagation operation to obtain error signals for neurons in each layer except the input layer. In the weight-update operation, the synaptic weights are then updated based on these error signals and the neuron output signals during forward propagation.

Training of ANNs, which may have multiple (e.g. 10 or more) neuron layers and millions of synaptic weights, is a computationally intensive task requiring substantial processing resources and extensive training time. Analog training methods based on crossbar arrays of memristive synapses have been proposed to alleviate these problems. These methods exploit the parallel computational capabilities of arrays of memristive devices, connected between row and column lines for applying signals to the devices, where each device implements a synapse with a weight corresponding to the (variable) device conductance. Such methods are described in: "Experimental demonstration and tolerancing of a large-scale neural network (165 000 synapses) using phase-change memory as the synaptic weight element", Burr et al., IEEE Transactions on Electron Devices 62(11), pp. 3498-3507, 2015; and "Acceleration of Deep Neural Network Training with Resistive Cross-Point Devices: Design Considerations", Gokmen & Vlasov, Frontiers in Neuroscience, Vol. 10, 2016. These systems perform the forward propagation, backpropagation, and weight-update computations on the memristive arrays by applying signals to the row and/or column lines, with pulsed signals, derived from the forward propagation signals and backpropagated errors, applied simultaneously to the row and column lines of a device for the weight-update operation. By exploiting the capabilities of memristive arrays in this way, these methods dramatically reduce computational complexity associated with ANN training. With both systems, however, there is a significant reduction in training accuracy compared to a high-precision 64-bit floating-point digital implementation. The Burr system is highly sensitive to device imperfections, and the Gokmen system would require an unachievably large number of conductance states for existing memristive devices to obtain an accuracy comparable to a floating-point implementation.

SUMMARY

According to at least one embodiment of the present invention there is provided a method for training an artificial neural network having a succession of layers of neurons and a set of crossbar arrays of memristive devices, connected between row and column lines, implementing layers of synapses interposed with the neuron layers. Each memristive device stores a weight $\hat{W}$ for a synapse interconnecting a respective pair of neurons in successive neuron layers. The method comprises performing forward propagation, backpropagation and weight-update operations of an iterative training scheme by, in at least one of the forward propagation and backpropagation operations of the scheme, applying input signals, associated with respective neurons, to one of row and column lines of the set of arrays to obtain output signals on the other of the row and column lines, and storing digital signal values corresponding to the input and output signals in a digital processing unit operatively coupled to the set of arrays. The weight-update operation of the scheme is performed by calculating, in the digital processing unit, digital weight-correction values $\Delta W$, dependent on the stored digital signal values, for respective memristive devices, and applying programming signals to those devices to update the stored weights $\hat{W}$ in dependence on the respective digital weight-correction values $\Delta W$.

Embodiments of the invention provide mixed-precision ANN training methods in which a set of memristive arrays are used for (inherently low-precision) computation in one or both of the forward and backpropagation steps, and a digital processing unit is used to perform a weight-update calculation for the weight-update step. This involves calculating a digital weight-correction value $\Delta W$, i.e. corresponding to an incremental change in a stored weight, for a memristive device, as a specific step of the weight update calculation. This calculation is performed with digital precision and the resulting digital values are then used to determine the programming signals applied to memristive devices to update the stored weights. This technique offers improved accuracy in the weight-update operation while retaining benefits associated with memristive arrays, i.e. significant speed, power and areal-density advantages. Embodiments of the invention thus offer fast, efficient ANN training methods based on memristive arrays. Accuracies comparable with floating-point implementations can be readily achieved as demonstrated for embodiments described below.

Preferred embodiments perform at least the forward propagation operation on the memristive arrays by applying the input signals to row lines of the set of arrays to obtain output signals on the column lines. To further exploit the parallel computational facility of memristive arrays, the backpropagation is preferably also performed on the array set by applying input signals to column lines of the set of arrays to obtain output signals on the row lines.

In a first weight update procedure, the digital processing unit may round each weight-correction value $\Delta W$ with a predetermined step-size $\varepsilon$ to produce a rounded correction value $\Delta \hat{W}$. A programming signal applied to a memristive device then adjusts the stored weight $\hat{W}$ by an amount dependent on the rounded correction value $\Delta \hat{W}$ for that device. This performs incremental update of the stored weights, as opposed to full reprogramming of new weights, with the advantage that the set of weights need not be stored in the digital processing unit.

In other embodiments, the digital processing unit may store digital weight values W corresponding to the weights $\hat{W}$ stored by respective memristive devices. In a second weight update procedure here, the digital processing unit may calculate new digital weight values for respective devices from the stored digital weight value and the digital weight-correction value $\Delta W$ for each device. A programming signal applied to a memristive device is then dependent on the new digital weight value for that device. This offers superior accuracy since new weight values are calculated with digital precision from the currently-stored weight values W as: new W=current W+$\Delta W$, whereby no information about $\Delta W$ is lost due to rounding as in the first method above.

In particularly preferred embodiments, the digital processing unit stores digital accumulation values $\chi$ for respective memristive devices. In a third weight-update procedure here, the digital processing unit calculates updated accumulation values for respective memristive devices from the weight-correction value $\Delta W$ and stored accumulation value $\chi$ for each device, and determines a weight adjustment amount A from the updated accumulation value for each device. A said programming signal applied to a memristive device then adjusts the stored weight $\hat{W}$ by an amount corresponding to the weight adjustment amount A for that device. The digital processing unit calculates new digital accumulation values for respective devices by subtracting the weight adjustment amount from the updated accumulation value for each device. This offers exceptionally accurate and efficient operation, retaining full accuracy of $\Delta W$ in the accumulation values $\chi$, as explained further below.

In the third weight-update procedure, the weight adjustment amount A may be determined by rounding the updated accumulation value for each memristive device with a predetermined step-size $\varepsilon$, indicative of weight-change of the device in response to application of a predetermined programming pulse, to obtain a number n of said programming pulses to be applied to the device. This allows simple implementation of programming signals as n pulses for each device. In other embodiments here, the digital processing unit determines the weight adjustment amount A by comparing the updated accumulation value for each memristive device with a predetermined threshold dependent on the step-size $\varepsilon$. If the updated accumulation value exceeds this threshold, a programming pulse is applied to the device. This allows programming signals to be implemented by a single pulse, so only one pulse is required per weight update.

At least one further embodiment of the invention provides apparatus for implementing an artificial neural network. The apparatus comprises a memcomputing unit and a digital processing unit operatively coupled to the memcomputing unit. The memcomputing unit comprises a set of crossbar arrays of memristive devices connected between row and column lines, each memristive device storing a weight $\hat{W}$ for a respective synapse, and a controller for controlling application of signals to the memristive devices via the row and column lines. The digital processing unit is adapted to control performance by the apparatus of forward propagation, backpropagation and weight-update operations of an iterative training scheme in accordance with a method described above.

Embodiments of the invention will be described in more detail below, by way of illustrative and non-limiting example, with reference to the accompanying drawings.

DETAILED DESCRIPTION

Figure 1:
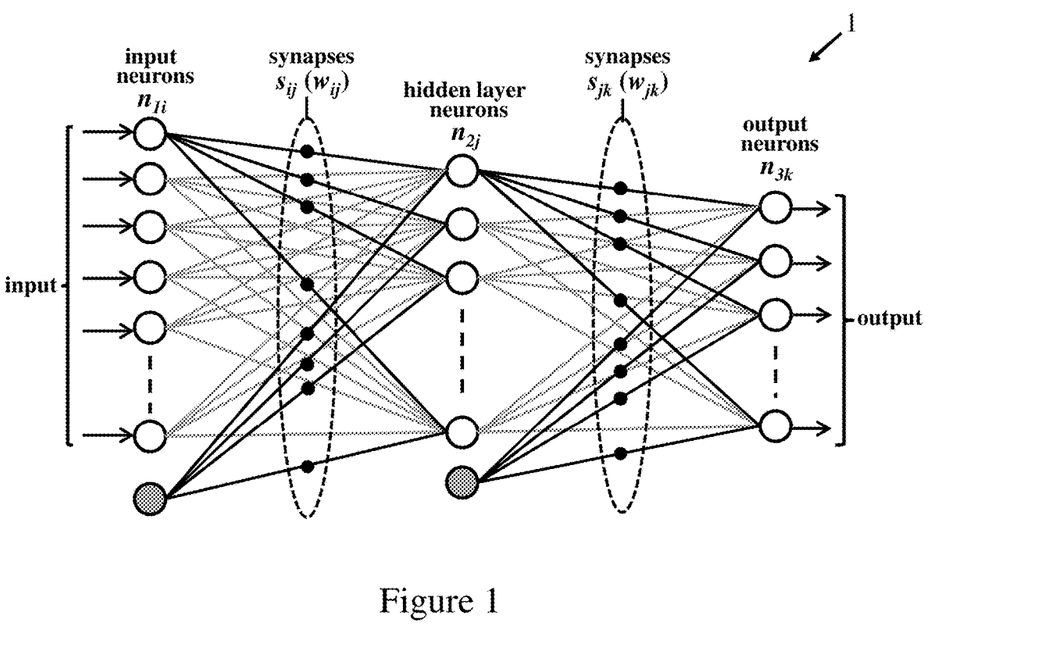
FIG. 1 is a schematic representation of an artificial neural network.

FIG. 1 illustrates the logical structure of an exemplary ANN. The ANN 1 comprises a succession of layers of neurons interposed with layers of synapses. In the simple example shown, the network has three neuron layers: a layer of input neurons which receive the network input signals; a layer of output neurons which provide the output signals of the network, and an intermediate ("hidden") layer of neurons between the input and output layers. Neurons in the input layer (layer 1) are denoted here by $n_{1i}$ ($1 \leq i \leq N_1$), neurons in the hidden layer (layer 2) are denoted by $n_{2j}$ ($1 \leq j \leq N_2$), and neurons in the output layer (layer 3) are denoted by $n_{3k}$ ($1 \leq k \leq N_3$), where $N_x$ is the number of neurons in layer x. Neurons in each layer are connected to neurons in the next layer via synapses $s_{ij}$ or $s_{jk}$ as indicated. Each synapse $s_{ij}$, $s_{jk}$ interconnects a respective pair of neurons in successive neuron layers. A signal relayed by a synapse $s_{ij}$ or $s_{jk}$ between its connected neurons is weighted according to a respective synaptic weight $w_{ij}$ or $w_{jk}$. The input and hidden neuron layers may include one or more bias neurons (shown shaded in the figure) which do not receive input signals but transmit predetermined bias signals to the next neuron layer. While a fully-connected configuration is shown, in general a neuron in any given layer may be connected to one or more neurons in the next layer, and networks may include one or more (commonly up to 30 or more) successive layers of hidden neurons.

Figure 2:
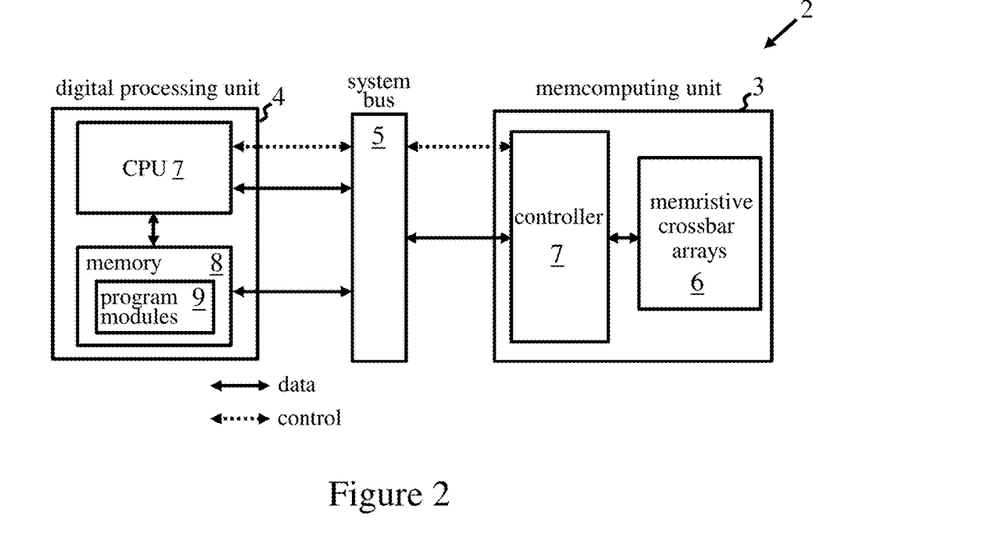
FIG. 2 is a schematic block diagram of apparatus embodying the invention for implementing an artificial neural network.

FIG. 2 shows apparatus embodying the invention for implementing an ANN 1. The apparatus 2 comprises a memcomputing unit 3 and a digital processing unit 4 which is operatively coupled, here via a system bus 5, to memcomputing unit 3. The memcomputing unit 3 comprises a set of (one or more) memristive crossbar arrays 6, and a controller 7 for controlling operation of the memcomputing unit. Digital processing unit 4 comprises a central processing unit (CPU) 7 and memory 8. Memory 8 stores one or more program modules 9 comprising program instructions executable by CPU 7 to implement functional steps of operations described below.

Figure 3:
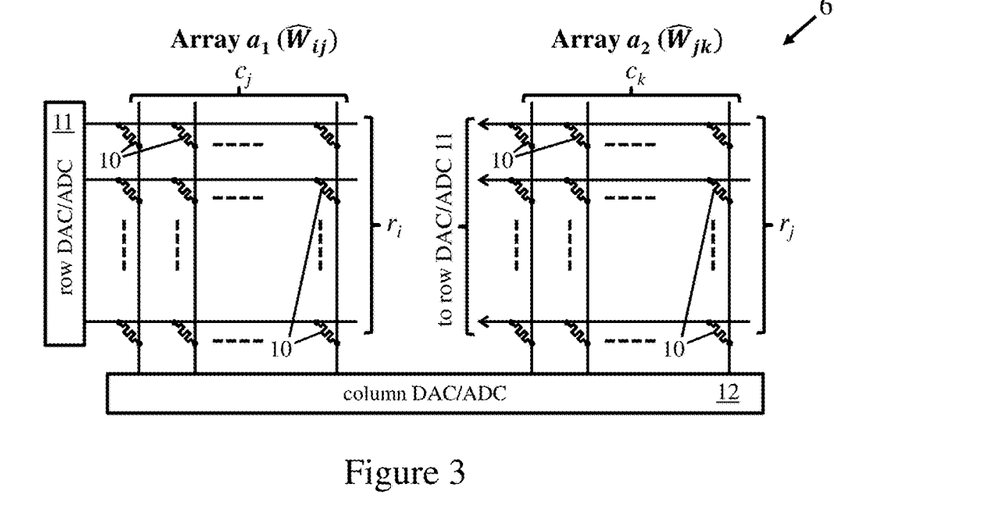
FIG. 3 illustrates structure of memristive arrays of the FIG. 2 apparatus.

FIG. 3 illustrates the logical structure of the set of memristive arrays 6. In this example, the set comprises two crossbar arrays of memristive devices 10 which are connected between row and column lines of the arrays. The first array $a_1$ implements the layer of synapses $s_{ij}$ between the first and second neuron layers in the ANN 1 of FIG. 1. Each memristive device 10 of array $a_1$ stores a weight $\hat{W}_{ij}$ for a respective synapse $s_{ij}$. The weight $\hat{W}_{ij}$ corresponds to electrical conductance of the device and can be varied in operation by application of programming signals to the device. The weights $\hat{W}_{ij}$ are thus inherently stored in low-precision as indicated by the accent ˆ. The devices 10 are arranged in logical rows and columns with each device connected been a particular row line and column line for application of signals to the device. The row lines $r_i$ of array $a_1$ can be viewed as connections between respective input neurons $n_{1i}$ and the synapses $s_{ij}$ of ANN 1. The column lines $c_j$ of array $a_1$ can similarly be viewed as connections between respective layer 2 neurons $n_{2j}$ and the synapses $s_{ij}$ of ANN 1. The row and column lines are connected to controller 7 of the memcomputing unit 2 via row and column digital-to-analog/analog-to-digital converters (DAC/ADCs) 11 and 12 which convert array input/output signals between the digital and analog domains.

The second array $a_2$ of array-set 6 implements the layer of synapses $s_{jk}$ between the second and third neuron layers of ANN 1. Structure corresponds directly to that of array $a_1$. Hence, devices 10 of array $a_2$ store weights $\hat{W}_{jk}$ for synapses $s_{jk}$, with row lines $r_j$ representing connections between respective layer 2 neurons $n_{2j}$ and synapses $s_{jk}$, and column lines $c_k$ representing connections between respective output layer neurons $n_{3k}$ and synapses $s_{jk}$.

Controller 7 provides the control circuitry for controlling application of signals to memristive devices 10 via the row and column lines of the arrays. As explained in detail below, signals are input to and output from the arrays in a "read" mode used for computation operations of apparatus 2, and programming signals are applied to memristive devices 10 in a "write" (programming) mode used for weight-update operations. The read/write control circuitry can be implemented in generally known manner according to the particular memristive synapse implementation in devices 10. A variety of memristive synapse devices are known in the art, e.g. based on resistive memory cells such as phase-change memory (PCM) cells. These devices comprise one or more memory cells which can be arranged in various circuit configurations to store information in the programmable conductance state of the cells. Preferred embodiments herein employ memristive devices based on a plurality of PCM cells, providing multi-bit storage of information, as described in more detail below. Controller 7 also controls input and output of data from/to system bus 5 by memcomputing unit 3 in operation.

Digital processing unit (DPU) 4 is adapted to control performance by apparatus 2 of operational steps of an iterative training scheme for ANN 1. The training process is controlled by CPU 7 via execution of program instructions loaded from program modules 9 in memory 8. Memory 8 also stores various data used by CPU 7 in operation, including data items supplied to, and received from, memcomputing unit 3 in the various steps of the training process. CPU 7 performs the calculations required in DPU 4 during the training process, and controls input and output of data from/to system bus 5 by DPU 4. CPU 7 also controls the operating mode of memcomputing unit 3 via control instructions sent via bus 5 to controller 7.

While an exemplary embodiment of apparatus 2 is described, DPU 4 may comprise one or more CPUs (including GPUs (graphics processing units)) which may be implemented by one or more microprocessors. Memory 8 may comprise one or more data storage entities, and may comprise main memory, e.g. DRAM (dynamic random access memory) and/or other storage which is physically separated from CPU 7, as well as cache and/or other memory local to CPU 7. In general, DPU 4 may be implemented by one or more (general- or special-purpose) computers/programmable data processing apparatus, and functional steps of processing operations performed by DPU 4 may be implemented in general by hardware or software or a combination thereof. Controller 7 may also comprise one or more processors which are configurable by software instructions to control memcomputing unit 2 to perform functions described below. Particular functional steps performed by controller 7 may be implemented in hardware or software or a combination thereof. Suitable software for implementing functional steps described will be readily apparent to those skilled in the art.

In some embodiments, DPU 4 and/or controller 7 may include electronic circuitry such as programmable logic circuitry, field-programmable gate arrays (FPGAs), or programmable logic arrays (PLAs) for executing program instructions to implement functions described. Where embodiments are described with reference to flowchart illustrations, it will be understood that each block of the flowchart illustrations and/or combinations of blocks in the flowchart illustrations can be implemented by computer-executable program instructions. Program instructions/program modules may include routines, programs, objects, components, logic, data structures, and so on that perform particular tasks or implement particular abstract data types. Blocks or combinations of blocks in a flowchart illustration may also be implemented by special-purpose hardware-based systems that perform the specified functions or acts or carry out combinations of special purpose hardware and computer instructions.

System bus 5 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

In general, the layers of synapses $s_{ij}$, $s_{jk}$ of ANN 1 may be implemented by one or more crossbar arrays of memristive devices 10. It will be appreciated that "rows" and "columns" of these arrays are logical designations only, and do not imply any constraint as to physical orientation or arrangement of components. In a typical PCM-based device array, however, devices and supply lines are arranged in a regular array of rows and columns as indicated schematically in FIG. 3. Dense cross-bar arrays of such memristive devices can be fabricated as integrated nanoscale systems using well-known material processing techniques, and offer massively parallel and highly area- and energy-efficient implementations.

Figure 4:
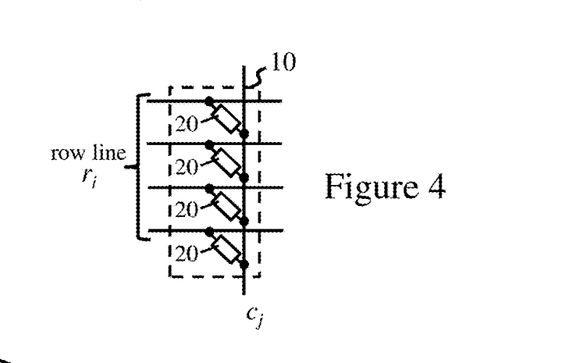
FIG. 4 is a schematic illustration of an exemplary memristive device for use in a memristive array.

FIG. 4 shows an exemplary implementation for a memristive device 10 based on a plurality of PCM cells. As is well known in the art, PCM cells exploit the variable-resistance characteristics of a volume of PCM material, e.g. a chalcogenide such as GST (Germanium-Antimony-Tellurium), disposed between a pair of electrodes providing the cell terminals. In this example, the device 10 comprises four PCM cells 20. One terminal of each cell 20 is connected to the column line $c_j$ of the device. The other terminal of each cell is connected to a respective component line of the row line r of the device. By application of appropriate programming pulses to a cell 20 via the corresponding component row line and column line, the cell can be programmed to a high-resistance (amorphous) or low-resistance (crystalline) state. Each cell 20 can thus store one bit of information, with the four cells collectively providing storage for five different weights depending on the number of cells in each of the high- and low-resistance states. This gives 2-bit precision for the stored weight $\hat{W}_{ij}$ using four cells 20 as shown, with $2^N$ cells providing N-bit precision in general. Programming of device 10 by controller 7 may be performed using a clock-based arbitration scheme to determine the order in which particular cells 20 are addressed to increase or decrease the stored weight. The stored weight can be "read" by applying a (low-voltage) read signal to (all components of) row line $r_i$ whereby the resulting current on column line $c_j$ of the device depends on the conductance of all four cells and hence the total stored weight $\hat{W}_{ij}$.

In the embodiment detailed below, the functionality of a neuron $n_{1i}$, $n_{2j}$, $n_{3k}$ of ANN 1 is effectively implemented in DPU 4 by applying a predetermined "activation" function to neuron input signals to generate the neuron output signals supplied as input to the next ANN layer. In the training operation of apparatus 2, input data for a training sample (e.g. pixel data for an image of a handwritten digit from the MNIST training dataset), is stored in memory 8. The input data points (e.g. image pixels) are notionally mapped to input-layer neurons $n_{1i}$ in accordance with a predetermined mapping which remains fixed for ANN operation. Training data typically comprises a huge number of samples (e.g. thousands of samples of hand-written digits) which are input to the network in the training process. During this process, the apparatus 2 implements an iterative method in which the weights $\hat{W}_{ij}$, $\hat{W}_{jk}$ stored by memristive devices 10 are repeatedly updated. In particular, DPU 4 controls performance by apparatus 2 of forward propagation, backpropagation and weight-update operations of an iterative training scheme described below.

Figure 5:
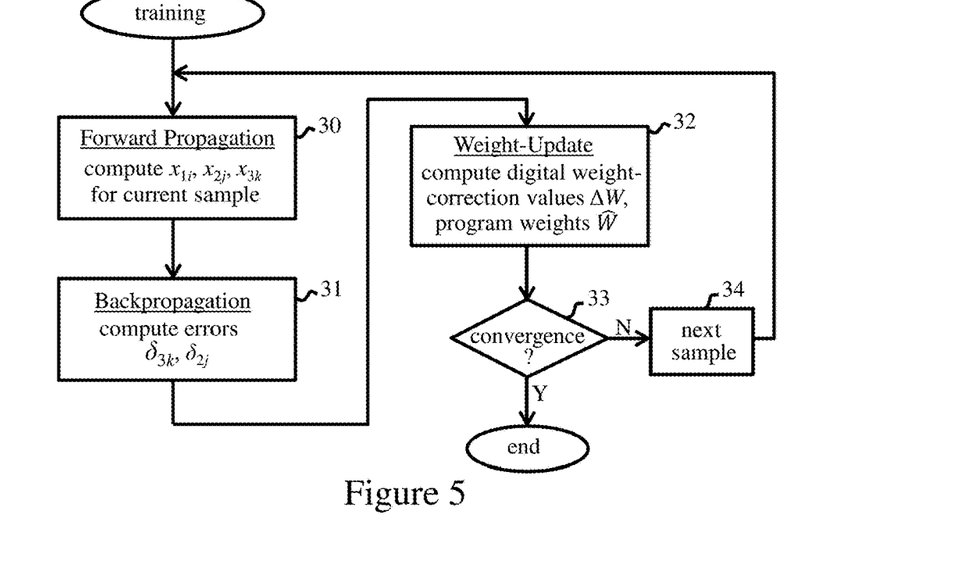
FIG. 5 indicates basic steps of a training method performed by the FIG. 2 apparatus.

Basic steps of the training scheme are indicated in the flowchart of FIG. 5. In the forward propagation operation (step 30), the input data for a current training sample is forward-propagated through ANN 1 from the input to the output neuron layer. This operation, detailed further below, involves calculating outputs, denoted by $x_{1i}$, $x_{2j}$ and $x_{3k}$ respectively, for neurons $n_{1i}$, $n_{2j}$, and $n_{3k}$ in DPU 4, and application of input signals to memristive arrays 6 to obtain array output signals used in these calculations. In the subsequent back-propagation operation (step 31), DPU 4 calculates error values (denoted by $\delta 31$) for respective output neurons $n_{3k}$ and propagates these error values back through ANN 1 from the output layer to the penultimate layer in the backpropagation direction. This involves application of input signals to memristive arrays 6 to obtain array output signals, and calculation of error values for neurons in all other layers except the input neuron layer, in this case errors $\delta_{2j}$ for the layer 2 neurons $n_{2j}$. In a subsequent weight update operation (step 32), the DPU computes digital weight-correction values $\Delta W$ for respective memristive devices 10 using values computed in the forward and backpropagation steps. The DPU 4 then controls memcomputing unit 3 to applying programming signals to the devices to update the stored weights $\hat{W}$ in dependence on the respective digital weight-correction values $\Delta W$. In decision step 33, the DPU 4 determines if a predetermined convergence condition has been achieved. (This condition may be defined in various ways for a training operation e.g. based on error values for the output neurons, change in error values between iterations, number of samples/iterations, etc., or as a function of more than one such parameter. The particular convergence condition is orthogonal to the operating principles described herein.) If not ("No" (N) at decision block 33), then the input data for the next training sample is loaded to CPU 7 in step 34, and operation reverts to step 30. The process thus iterates until convergence is achieved, whereupon the training process terminates.

The weights $\hat{W}$ stored in memristive arrays 6 may be initialized to predetermined values, or may be randomly distributed for the start of the training process. Particular constraints on the weight distribution for initialization may depend on e.g. network size and the neuron activation function $f$ (described below) for a given convergence condition to be achieved. Weight update step 32 may be performed for every iteration, or after a predetermined number of backpropagation operations, and may involve update of all or a selected subset of the weights $\hat{W}$ as described further below. In any case, the weights $\hat{W}$ are repeatedly updated during the training process as the network learns from the training data.

Figure 6:
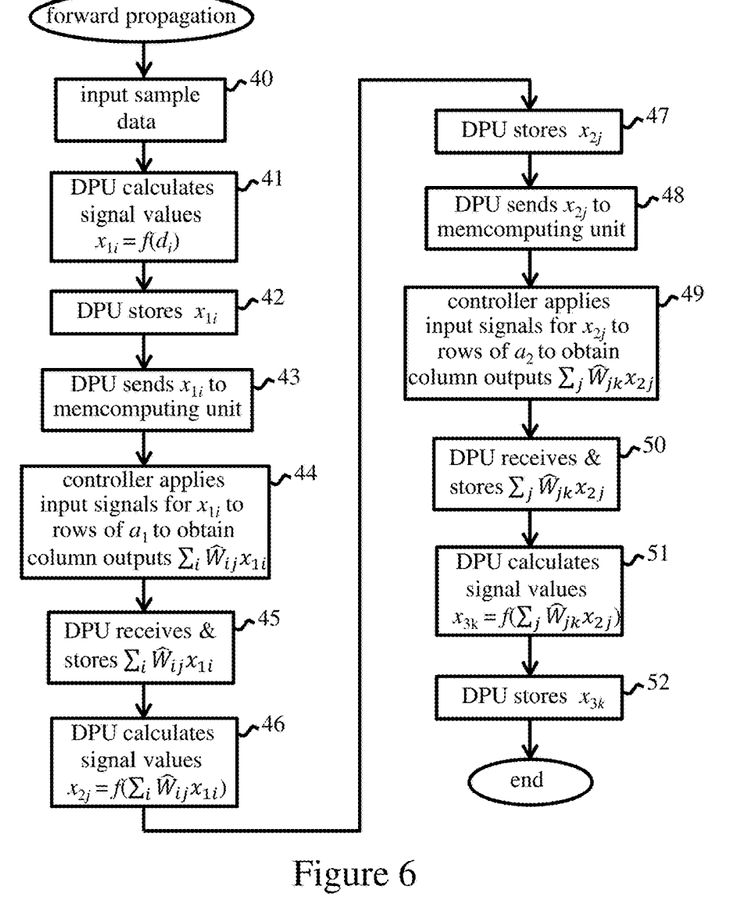
FIG. 6 indicates more detailed steps of a forward propagation operation.
Figure 7:
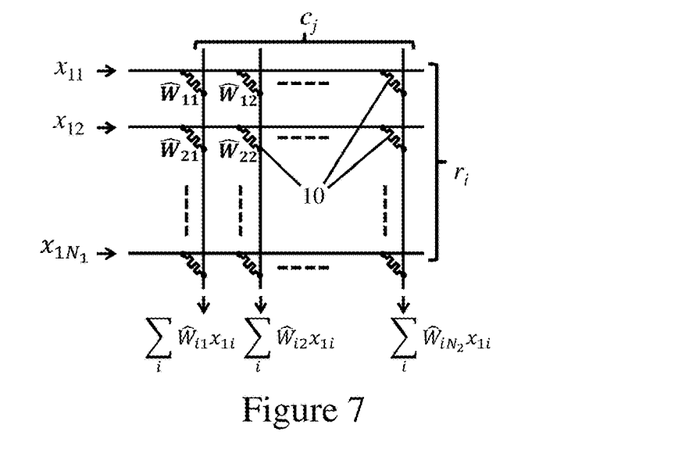
FIG. 7 indicates operation of a memristive array in the forward propagation operation.

FIG. 6 indicates more detailed steps of the forward propagation operation for the ANN of FIG. 1. Data for the current training sample is input in step 40. In step 41, the DPU calculates digital signal values $x_{1i}$ for respective input layer neurons $n_{1i}$ by applying an activation function, denoted here by $f$, to the input data $(d_i)$ mapped to that neuron. The activation function $f$ typically comprises a non-linear function such as a sigmoid function, tan h function, reLu function, etc. The signal values $x_{1i}$ for the input layer neurons are stored in memory 8 in step 42. In step 43, DPU 4 supplies the signal values $x_{1i}$ to memcomputing unit 3 via bus 5 and sets controller 7 to the forward propagation mode. In step 44, controller 7 supplies the signal values $x_{1i}$ to row DAC 11 of memristive array $a_1$. Corresponding analog voltage signals, associated with respective neurons $n_{1i}$, are thus applied to respective row lines $r$ of the array as indicated schematically in FIG. 7. The resulting output current signals on column lines $c_j$ thus correspond to weighted sums of the input signals according to the weights $\hat{W}_{ij}$ of devices 10 in each column. These output signals correspond to the signals received by respective layer 2 neurons $n_{2j}$ of ANN 1. The column output signals are converted to digital signal values $\Sigma_i \hat{W}_{ij} x_{1i}$ by column ADC 12 and the digital signal values are supplied by controller 7 to DPU 4. In step 45, DPU 4 stores the received digital signal values $\Sigma_i \hat{W}_{ij} x_{1i}$ in memory 8. In step 46, DPU 4 calculates digital signal values $x_{2j}$ for respective layer 2 neurons $n_{2j}$ as:

$$x_{2j}=f(\Sigma_i \hat{W}_{ij} x_{1i}).$$

The signal values $x_{2j}$ are stored in memory 8 in step 47. The DPU thus implements the layer 2 neurons $n_{2j}$ by applying the activation function $f$ to the digital signal values corresponding to the array output signals obtained from the preceding neuron layer to produce the digital signal values corresponding to the array input signals associated with those neurons $n_{2j}$.

Steps 43 to 47 above implement forward propagation of signals between layers 1 and 2 of ANN 1. Steps 48 to 52 correspond to steps 43 to 47 respectively but propagate signals between layers 2 and 3. Hence, input signals associated with the neurons $n_{2j}$ are applied to row lines $r_j$ of array $a_2$ in step 49 to obtain output signals on the column lines $c_k$. The corresponding digital signal values $\Sigma_j \hat{W}_{jk} x_{2j}$ are supplied to DPU 4 which calculates the digital signal values $x_{3k}$ for the output neurons $n_{3k}$ as:

$$x_{3k}=f(\Sigma_j \hat{W}_{jk} x_{2j}).$$

The signal values $x_{3k}$ provide the network output for the forward propagation operation.

Figure 8:
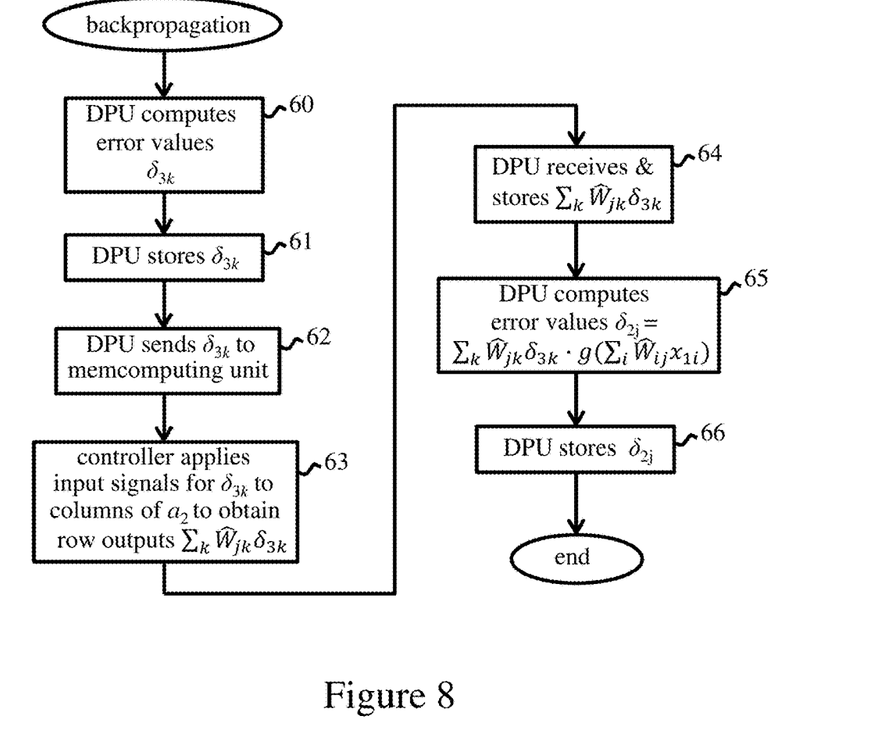
FIG. 8 indicates more detailed steps of a backpropagation operation.

FIG. 8 indicates more detailed steps of the backpropagation operation for ANN 1. In step 60, for the last layer of neurons in the forward propagation operation, i.e. output neurons $n_{3k}$, the DPU 4 calculates respective error values $\delta_{3k}$. The error values $\delta_{3k}$ are dependent on an expected output of the ANN for the current training sample and the digital signal values $\Sigma_j \hat{W}_{jk} x_{2j}$ corresponding to the array $a_2$ output signals obtained from the preceding neuron layer, layer 2. In particular, the output $x_{3k}=f(\Sigma_j \hat{W}_{jk} x_{2j})$ of each neuron $n_{3k}$ is subtracted from the expected output for that neuron to obtain the corresponding error value $\delta_{3k}$. The expected output for each neuron $n_{3k}$ can be determined from the known classification label for the current training sample, e.g. label from 0 to 9 for MNIST samples. (For example, each class 0 to 9 may be represented by a respective output neuron which is expected to have the largest output when a sample in that class is "shown" to the network. Ideally, this neuron output should be "1" and all other neuron outputs corresponding to other classes should be "0". These 1's and 0's indicating the sample class provide the expected output of the network). The DPU 4 stores the error values $\delta_{3k}$ in step 61. In step 62, DPU 4 supplies the error values $\delta_{3k}$ to memcomputing unit 3 via bus 5 and sets controller 7 to the backpropagation mode. In step 63, controller 7 supplies the error values $\delta_{3k}$ to column DAC 12 of memristive array $a_2$. (The error values may be scaled accordingly in DPU 4 to use the full range of DAC 12 when applied as voltages $$\left(\text{e.g. } \delta_k = \delta_k / \max_k |\delta_k|\right).$$

Figure 9:
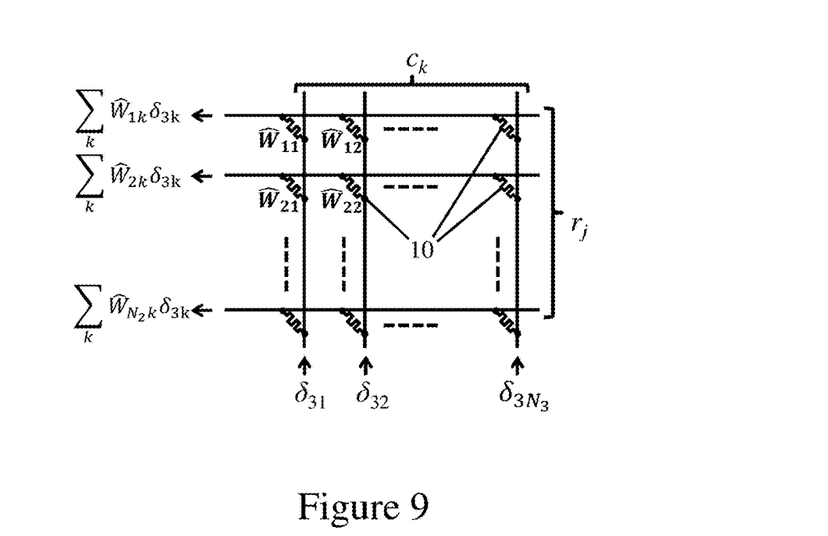
FIG. 9 indicates operation of a memristive array in the backpropagation operation.

Corresponding analog voltage signals, associated with respective neurons $n_{3k}$, are thus applied as input signals to respective column lines $c_k$ of the array as indicated schematically in FIG. 9. The resulting output current signals on row lines $r_j$ thus correspond to weighted sums of the input signals according to the weights $\hat{W}_{jk}$ of devices 10 in each row. The row output signals are converted to digital signal values $\Sigma_k \hat{W}_{jk} \delta_{3k}$ by row ADC 11 and the digital signal values are supplied by controller 7 to DPU 4. In step 64, DPU 4 receives and stores the output signal values $\Sigma_k \hat{W}_{jk} \delta_{3k}$. In step 65, DPU 4 calculates respective error values $\delta_{2j}$ for layer 2 as:

$$\delta_{2j}=\Sigma_k \hat{W}_{jk} \delta_{3k} g(\Sigma_i \hat{W}_{ij} x_{1i}).$$

where g represents a non-linear function different to the activation function $f$ and comprises the derivative off in the specific case where the training algorithm minimizes the mean square error objective function. The respective error values $\delta_{2j}$ for neurons in layer 2 are thus based on the digital signal values $\Sigma_k \hat{W}_{jk} \delta_{3k}$ corresponding to the array output signals obtained from the preceding neuron layer in the backpropagation operation (layer 3) and the array output signals $\Sigma_i \hat{W}_{ij} x_{1i}$ obtained from the preceding neuron layer (layer 1) in the forward propagation operation. The error values $\delta_{2j}$ are stored in memory 8 in step 66.

Steps 62 to 66 above implement backpropagation of error signals between layers 3 and 2 of ANN 1. For ANNs with additional hidden layers, steps 62 to 66 would be repeated for each subsequent neuron layer up to the penultimate neuron layer in the backpropagation direction. Since layer 2 is the penultimate layer in this example, step 66 completes the backpropagation operation here.

Figure 10:
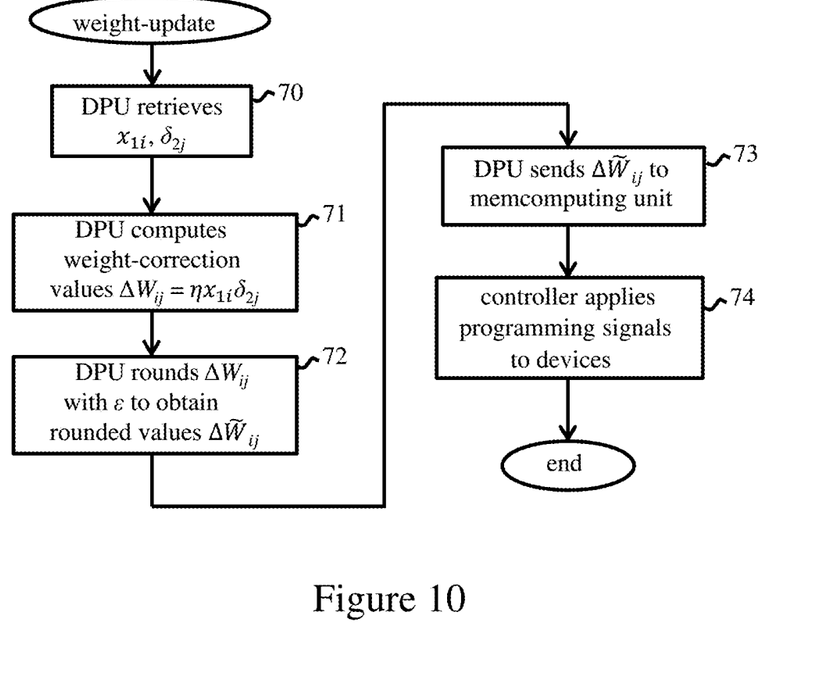
FIG. 10 indicates steps of a first weight update operation.

FIG. 10 represents steps of the weight-update operation in a first embodiment. For simplicity, operation will be described for devices in the first array $a_1$. In step 70, the layer 1 signal values $x_{1i}$ and layer 2 error values $\delta_{2j}$ are retrieved from memory in DPU 4. In step 71, the DPU calculates the digital weight correction values $\Delta W$ for respective devices 10 in array $a_1$ as:

$$\Delta W_{ij} = \eta x_{1i} \delta_{2j}$$

where $\eta$ is a predefined learning parameter for the network. The weight-correction value $\Delta W_{ij}$ for a device corresponding to a synapse $s_{ij}$ interconnecting a pair of neurons $n_{1i}$ and $n_{2j}$ in ANN 1 is thus calculated as a function of the input signal received from neuron $n_1$ in the forward propagation operation and the error signal calculated for neuron $n_2$ in the backpropagation operation. In step 72, DPU 4 rounds each weight-correction value $\Delta W_{ij}$ with a predetermined step-size $\varepsilon$ to produce a rounded correction value $\Delta \tilde{W}_{ij}$, i.e. $\Delta \tilde{W}_{ij}$=round($\Delta W_{ij}/\varepsilon$). Conventional or stochastic rounding may be used here as desired. The step size $\varepsilon$ preferably indicates the weight-change of a memristive device in response to application of a predetermined programming pulse, i.e. a pulse of predetermined amplitude and duration. In step 73, DPU 4 sends the rounded correction values $\Delta \tilde{W}_{ij}$ for devices 10 to memcomputing unit 3 and sets controller 7 to the programming mode. In step 74, controller 7 applies a programming signal to each device 10 to adjust the stored weight $\hat{W}_{ij}$ by an amount dependent on the rounded correction value $\Delta \tilde{W}_{ij}$ for that device. The programming signal here may comprise a number of the aforementioned programming pulses corresponding to the rounded correction value $\Delta \tilde{W}_{ij}$. The resulting stored weight is thus updated to $\hat{W}_{ij} + \Delta \tilde{W}_{ij}$ = new $\hat{W}_{ij}$.

In some embodiments, weight-correction values $\Delta W_{ij}$ may be computed for all devices 10 in the array. In others, $\Delta W_{ij}$ may be computed for only a subset of devices, e.g. a randomly-selected subset, or devices for which $x_{1i}$ and/or $\delta_{2j}$ exceed a threshold level. In general, error values $\delta_{2j}$ may be positive or negative, whereby weights may be increased ("potentiated") or decreased ("depressed") according to sign of $\Delta \tilde{W}_{ij}$. Programming pulses, and the step size ε, may differ for potentiation and depression depending on characteristics of the memristive devices. Also, weight updates may be performed after backpropagation in every iteration of the training scheme ("online training"), or after a certain number K of iterations ("batch training"). In the latter case, weight-correction values $\Delta W_{ij}$ can be accumulated in DPU 4 over K training samples.

Weights $\hat{W}_{jk}$ of devices in array $a_2$ are similarly updated based on rounded weight correction values $\Delta \tilde{W}_{jk}$ calculated from the digital weight-correction values $\Delta W_{jk} = \eta x_{2j} \delta_{3k}$ for these devices. Steps of the FIG. 10 process may be performed in parallel for different memristive arrays, or sequentially for each array in turn. Similarly, steps of the weight update process may be performed sequentially for particular memristive devices or subsets of devices in each array. Different programming pulses and step sizes E may also be used for devices implementing different synapse layers in some embodiments.

The above system implements a mixed-precision ANN training method in which the low-precision memristive arrays are exploited for the forward and backpropagation computations, but the weight-update operation is based on weight-correction values $\Delta W$ calculated digitally in the DPU 4. The weight-correction values are thus calculated with digital precision, preferably at least 16-bit (fixed- or floating-point) precision, and the resulting digital values are used to determine programming signals for the arrays. This technique improves accuracy in the weight-update operation while exploiting the high-speed, low-power parallel computing capabilities of the memristive arrays. The stored weights are incrementally updated, as opposed to fully reprogrammed, and sets of weights for the memristive arrays need not be stored in DPU 4, reducing memory requirements.

Figure 11:
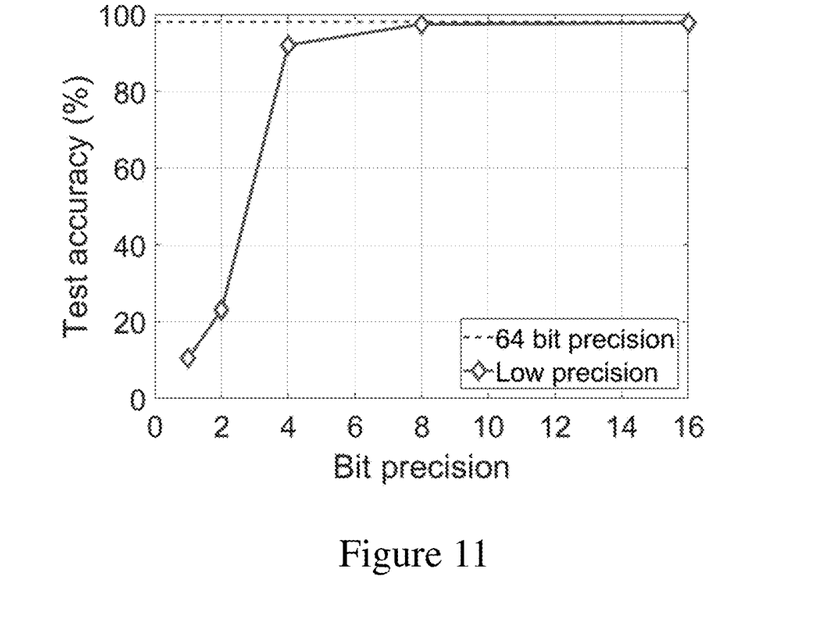
FIG. 11 shows simulation results for a training method using the first weight update operation.

Following training of ANN 1, the apparatus 2 can be used in a test (or "inference") mode to classify input data based on the trained weights $\hat{W}_{ij}$, $\hat{W}_{jk}$. In the inference mode, input data (e.g. MNIST test digits) are supplied to the network which operates in the forward propagation mode, and the input data is classified (e.g. as digit 0 to 9) based on the network output. Classification can be performed in DPU 7 using a softmax function for example. FIG. 11 shows simulation results for inference operation with MNIST test data following training using the above weight-update operation with stochastic rounding in step 72. Test accuracy is plotted against bit-precision for storage of weights $\hat{W}$ in devices 10. The equivalent results obtained with a full 64-bit floating-point training method are also shown for comparison. It can be seen that test accuracy of the above method comes close to 64-bit precision results with only 4-bit precision of stored weights $\hat{W}$. With 8 or more bit precision in weights $\hat{W}$, test accuracy is equivalent to the 64-bit precision implementation.

With the first weight-update method above, classification accuracy may be reduced if the step-size ε is large or the weight-updates are performed in an inaccurate manner. This is because accurate information about $\Delta W$ is lost after rounding so that errors cannot be accounted for in a precise manner. Preferred weight-update procedures addressing this issue are described in the following.

Figure 12:
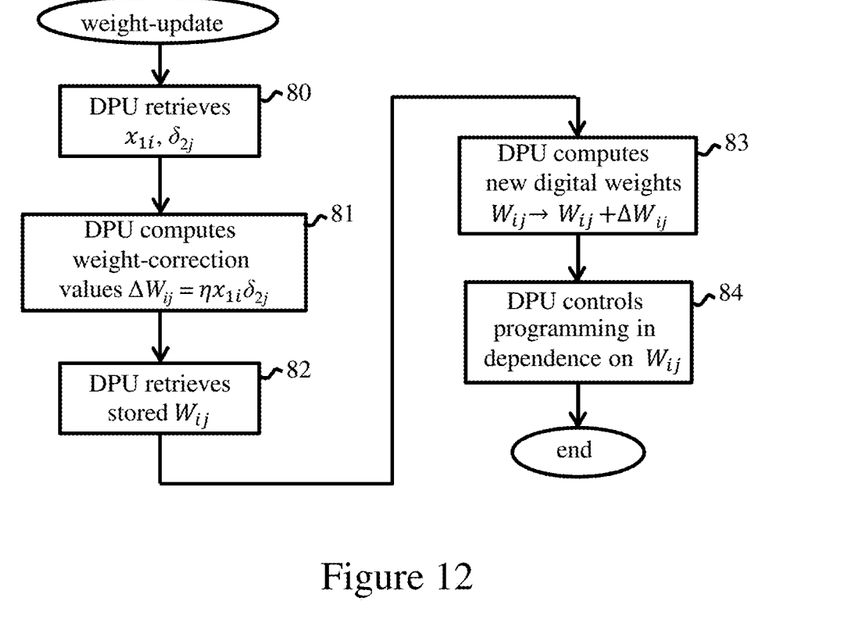
FIG. 12 indicates steps of a second weight update operation.

FIG. 12 indicates steps of a second embodiment of the weight-update procedure. In this embodiment, DPU 4 stores a set of (high-precision) digital weight values W in memory 8 corresponding to the weights $\hat{W}$ stored by respective memristive devices 10 in array-set 6. Operation is again described for devices in array $a_1$ here. In step 80, the layer 1 signal values $x_{1i}$ and layer 2 error values $\delta_{2j}$ are retrieved from memory in DPU 4. In step 81, the DPU calculates the digital weight correction values $\Delta W$ of devices 10 as before:

$$\Delta W_{ij} = \eta x_{1i} \delta_{2j}$$

In step 82, DPU 4 retrieves the digital weight values W for respective devices 10 from memory 8. In step 83, DPU 4 calculates new digital weight values for respective devices from the current digital weight value W and the digital weight-correction value $\Delta W$ calculated in step 81 for each device: $W_{ij} + \Delta W_{ij}$ = new $W_{ij}$. This calculation is thus performed with digital precision, preferably high precision, i.e., at least 16-bit precision and may be performed with e.g. 32- or 64-bit precision if desired. In step 84, DPU 4 controls memcomputing unit 3 to apply a programming signal to each device 10 dependent on the new digital weight value $W_{ij}$ for that device.

In one implementation here, step 84 may be performed by reading the weights $\hat{W}$ stored by respective memristive devices via read-mode operation of controller 7, and then calculating, in DPU 4, a difference between the new digital weight value W for a device and the read weight $\hat{W}$ for that device. A programming signal is then applied to the device to adjust the stored weight $\hat{W}$ by an amount dependent on the calculated difference for that device. The difference values here may be (deterministically or stochastically) rounded according to a step size ε indicating weight-change of a device in response to application of a predetermined programming pulse, and the programming signal here may comprise a number of programming pulses corresponding to the rounded difference value. The stored weights $\hat{W}_{ij}$ are thus incrementally updated.

In another implementation of step 84, instead of incremental updates the weights $\hat{W}_{ij}$ may be completely reprogrammed. In this case, programming signals are applied to reprogram each device based on the new digital weight value W for the device. This may be performed, for example, by a program-and-verify scheme in which a weight is iteratively programmed and read to bring $\hat{W}_{ij}$ as close as possible to the corresponding digital value W. A (deterministically or stochastically) rounded version of W may also be used here.

Figure 13:
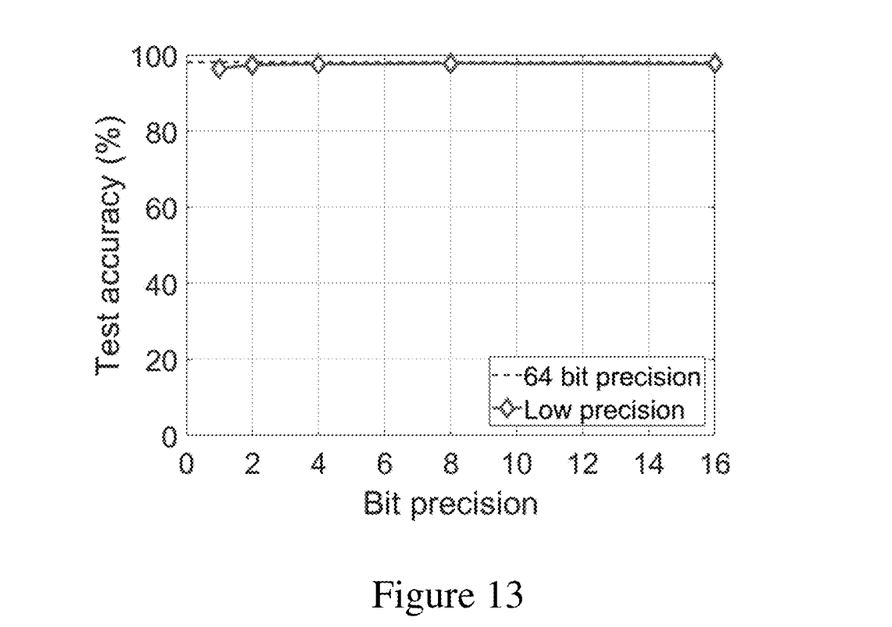
FIG. 13 shows simulation results for a training method using the second weight update operation.

The FIG. 12 method leads to final classification accuracies very close to a full 64-bit floating point implementation. This is illustrated in FIG. 13 for the method in which weights are reprogrammed based on a deterministically rounded version of W. Classification accuracy is improved because the W+$\Delta W$ calculation is done in high precision. Hence, no information about $\Delta W$ is lost and the process compensates accordingly for potentially inaccurate updates of $\hat{W}_{ij}$.

Figure 14:
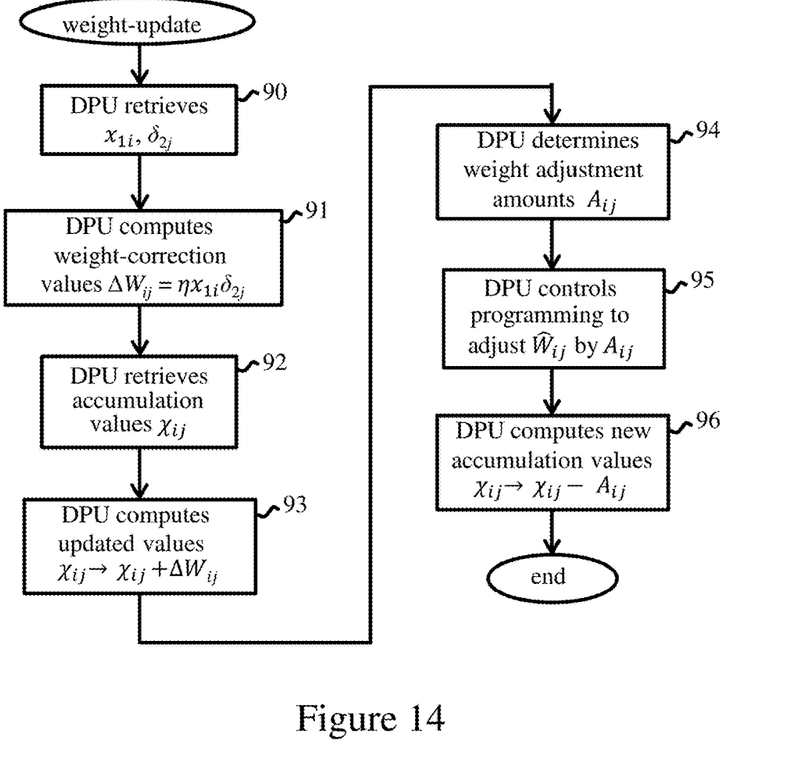
FIG. 14 indicates steps of a third weight update operation.

The FIG. 12 method involves additional overhead due to reading back weights, or reprogramming the entire array, at every weight update, and this may be impractical for some implementations. FIG. 14 indicates steps of a third, particularly preferred weight-update method which avoids this overhead. In this method, DPU 4 stores a set of (high-precision) digital accumulation values $\chi$ in memory 8 for respective memristive devices 10 in array-set 6. These accumulation values $\chi$ are initialized to zero at the start of the training operation. Steps 90 and 91 of FIG. 14 correspond to steps 80 and 81 of FIG. 12. In step 92, DPU 4 retrieves the digital accumulation values $\chi$ for respective devices 10 from memory 8. In step 93, DPU 4 calculates updated accumulation values for respective devices from the weight-correction value $\Delta W$ and stored accumulation value $\chi$ for each device: $\chi_{ij} + \Delta W_{ij} =$ updated $\chi_{ij}$. In step 94, DPU 4 determines a weight adjustment amount $A_{ij}$ from the updated accumulation value $\chi_{ij}$ for each device. Detailed examples of this step are described below. In step 95, DPU 4 controls memcomputing unit 3 to apply a programming signal to each device 10 to adjust the stored weight $\hat{W}_{ij}$ by an amount corresponding to the weight adjustment amount $A_{ij}$ for that device. In step 96, DPU 4 then calculates new digital accumulation values for respective devices by subtracting the weight adjustment amount from the updated accumulation value for each device: $\chi_{ij} - A_{ij} =$ new $\chi_{ij}$. The accumulation value calculations are thus performed with digital precision, preferably at least 16-bit precision and may be performed with higher (e.g. 32- or 64-bit) precision if desired.

Figure 15:
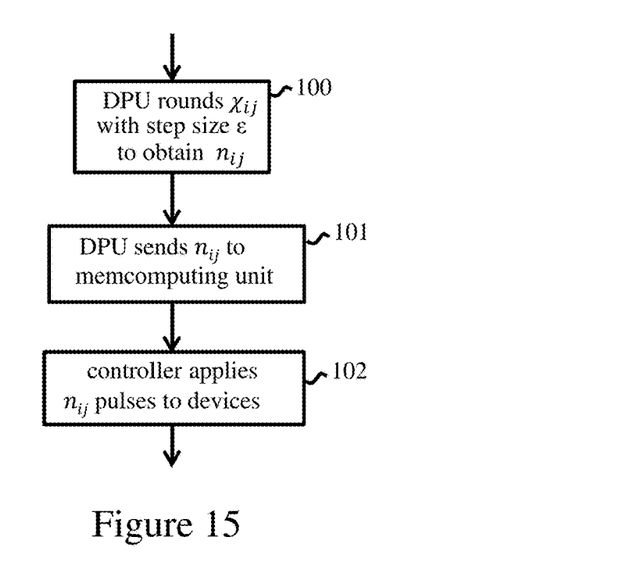
FIGS. 15 and 16 indicate different implementations for steps of the FIG. 14 operation.

A first example of the procedure for calculating the weight update amount $A_{ij}$ is illustrated in FIG. 15. Steps 100 through 102 implement steps 94 and 95 of FIG. 14. In step 100, DPU 4 determines the weight adjustment amounts $A_{ij}$ by rounding (deterministically or stochastically) the updated accumulation value $\chi_{ij}$ for each device with a predetermined step-size $\varepsilon$, where $\varepsilon > 0$. Again, this step-size $\varepsilon$ is indicative of weight-change of a memristive device in response to application of a predetermined programming pulse. The rounded result gives a number $n_{ij} =$ round$(\chi_{ij}/\varepsilon)$ of these programming pulses to be applied to the device. The weight adjustment amount for each device is thus $A_{ij} = n_{ij}\varepsilon$ here. In general, accumulation values $\chi_{ij}$, and hence the value of $n_{ij}$, may be positive or negative, and weights may be potentiated or depressed according to sign of $n_{ij}$. (Programming pulses, and the step size $\varepsilon$, may differ for potentiation and depression and may also differ for different ANN layers). DPU 4 sends the resulting numbers $n_{ij}$ to memcomputing unit 3 in step 101. If $n_{ij} > 0$, controller 7 applies $|n_{ij}|$ potentiation programming pulses to the device storing $\hat{W}_{ij}$. If $n_{ij} < 0$, controller 7 applies $|n_{ij}|$ depression programming pulses to the device. Returning to step 96 of FIG. 14, the new accumulation value for each device is calculated as: $\chi_{ij} - n_{ij}\varepsilon$.

Figure 16:
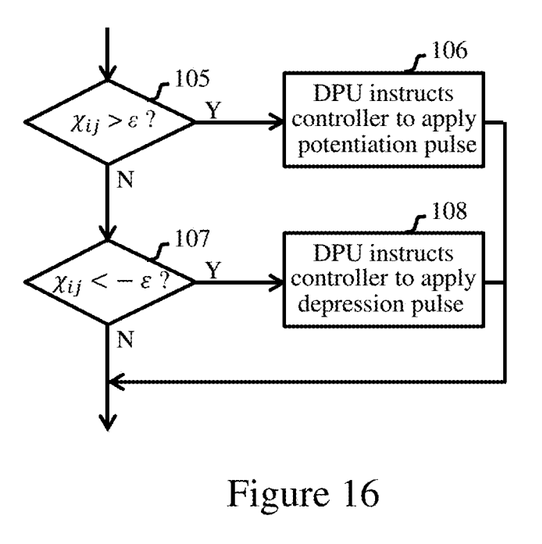

FIG. 16 gives a second example of the procedure for calculating the weight update amount $A_{ij}$. Steps 105 through 108 implement steps 94 and 95 of FIG. 14. In this procedure, DPU 4 compares the updated accumulation value $\chi_{ij}$ for each memristive device with a predetermined threshold dependent on the step-size $\varepsilon$, where c is defined as before. In this example, the threshold is $\pm E$ depending on the corresponding sign of $\chi_{ij}$. If $\chi_{ij} > \varepsilon$ ("Yes" at decision step 105), then in step 106 the DPU instructs controller 7 to apply one potentiation programming pulse to the device. Otherwise, operation continues to decision step 107. If $\chi_{ij} < -\varepsilon$ here, then in step 108, DPU 4 instructs controller 7 to apply one depression programming pulse to the device. For $-\varepsilon \leq \chi_{ij} \leq \varepsilon$ the weight $\hat{W}_{ij}$ is unchanged. Hence, the weight adjustment amount $A_{ij}$ for a device is either zero or $\pm \varepsilon$ here, and the new accumulation value is calculated accordingly in step 96 of FIG. 14.

The FIG. 16 embodiment requires only a single programming pulse to be applied per weight update, offering simpler hardware implementation in memcomputing unit 3. Various other thresholds based on step size $\varepsilon$, eg $\pm \varepsilon/2$, may be employed as desired with this technique.

Figure 17:
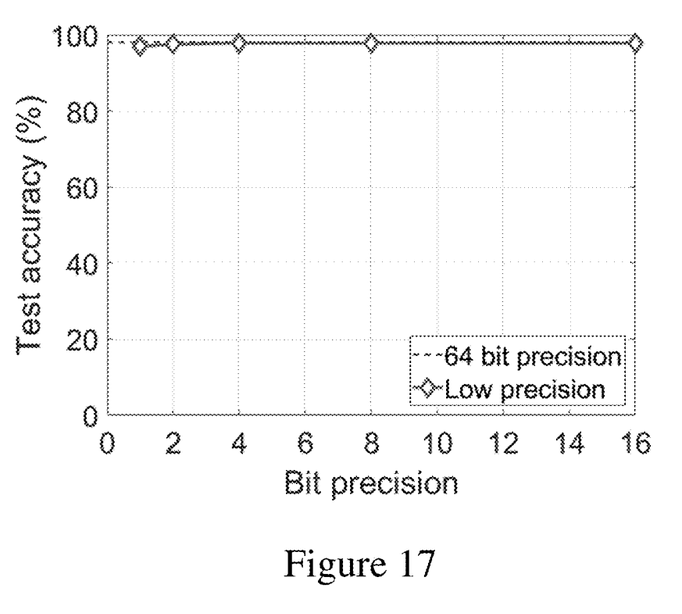
FIG. 17 shows simulation results for a training method using the third weight update operation.

Weight update methods based on FIG. 14 avoid the need to fully reprogram or readback the weights $\hat{W}$, while at the same time keeping all the information about $\Delta W$ in the digital accumulation values $\chi$. This provides an exceptionally efficient implementation for fast, high-accuracy ANN training. The excellent classification accuracies achievable with this technique using the FIG. 15 method are shown in FIG. 17.

Numerous changes and modifications can of course be made to the exemplary embodiments described. For example, embodiments can be envisaged in which the training method uses memcomputing unit 3 for only one of the forward and backpropagation steps. For example, the forward computation may be performed using array-set 6, with backpropagation computations done in DPU 4. Also, while the neuron activation function $f$ is implemented with high precision in DPU 4 above, in other embodiments the neuron functionality may be implemented by analog circuits in memcomputing unit 3.

In general, memristive devices 10 may be implemented in any desired manner, e.g. based on one or a plurality of PCM cells and/or other memristive memory elements in various circuit arrangements. Any type of memristive memory element may be used, e.g. PCM or other resistive memory cells such as resistive RAM (RRAM, or ReRAM) cells including conductive bridge RRAM cells, oxide or metal-oxide RRAM cells, carbon RRAM cells, and magneto-resistive random access memory (MRAM) elements, ferroelectric random access memory (FeRAM) elements, optical memory elements, and circuit devices, e.g. CMOS circuits, comprising transistors, resistors, capacitors, and/or inductors, emulating behavior of memristive elements.

In some cases, steps of flow diagrams may be implemented in a different order to that shown and steps may be performed in parallel as appropriate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for training an artificial neural network having a succession of layers of neurons and a set of crossbar arrays of memristive devices, connected between row and column lines, implementing layers of synapses interposed with the neuron layers whereby each memristive device stores a weight $\hat{W}$ for a synapse interconnecting a respective pair of neurons in successive neuron layers, the method comprising performing forward propagation, backpropagation and weight-update operations of an iterative training scheme by:

in at least one of the forward propagation and backpropagation operations of said scheme, applying input signals, associated with respective neurons, to one of row and column lines of the set of arrays to obtain output signals on the other of said row and column lines;

storing digital signal values corresponding to said input and output signals in a digital processing unit operatively coupled to the set of arrays; and performing the weight-update operation of said scheme by calculating, in the digital processing unit, digital weight-correction values $\Delta W$, dependent on said digital signal values, for respective memristive devices, and applying programming signals to those devices to update the stored weights $\hat{W}$ in dependence on the respective digital weight-correction values $\Delta W$.

2. The method of claim 1, further comprising, in the forward propagation operation, applying said input signals to row lines of the set of arrays to obtain output signals on the column lines.

3. The method of claim 2, further comprising, in the backpropagation operation, applying said input signals to column lines of the set of arrays to obtain output signals on the row lines.

4. The method of claim 1, further comprising, in the digital processing unit, rounding each weight-correction value $\Delta W$ with a predetermined step-size $\varepsilon$ to produce a rounded correction value $\Delta \tilde{W}$, wherein a said programming signal applied to a memristive device adjusts the stored weight $\hat{W}$ by an amount dependent on the rounded correction value $\Delta \tilde{W}$ for that device.

5. The method of claim 4, wherein said digital weight-correction values are calculated by the digital processing unit with at least 16-bit precision.

6. The method of claim 1, further comprising:
in the digital processing unit, storing digital weight values corresponding to the weights $\hat{W}$ stored by respective memristive devices; and
in the weight-update operation, calculating in the digital processing unit new digital weight values for respective devices from the stored digital weight value and the digital weight-correction value $\Delta W$ for each device;
wherein a said programming signal applied to a memristive device is dependent on the new digital weight value for that device.

7. The method of claim 6, further comprising, in the weight-update operation:
reading the weights $\hat{W}$ stored by respective memristive devices; and
in the digital processing unit, calculating a difference between said new digital weight value for a device and the read weight $\hat{W}$ for that device;
wherein a said programming signal applied to a memristive device adjusts the stored weight $\hat{W}$ by an amount dependent on said difference for that device.

8. The method of claim 6, further comprising, in the weight-update operation, applying said programming signals to reprogram each device based on the new digital weight value for that device.

9. The method of claim 6, wherein said digital weight values are stored by the digital processing unit with at least 16-bit precision.

10. The method of claim 1, comprising storing, in the digital processing unit, digital accumulation values for respective memristive devices and, in the weight-update operation:
in the digital processing unit, calculating updated accumulation values for respective memristive devices from the weight-correction value $\Delta W$ and stored accumulation value for each device, and determining a weight adjustment amount from the updated accumulation value for each device, wherein a said programming signal applied to a memristive device adjusts the stored weight $\hat{W}$ by an amount corresponding to the weight adjustment amount for that device; and
in the digital processing unit, calculating new digital accumulation values for respective devices by subtracting the weight adjustment amount from the updated accumulation value for each device.

11. The method of claim 10, comprising, in the digital processing unit, determining said weight adjustment amount by rounding the updated accumulation value for each memristive device with a predetermined step-size $\varepsilon$, indicative of weight-change of the device in response to application of a predetermined programming pulse, to obtain a number n of said programming pulses to be applied to the device, wherein the programming signal applied to that memristive device comprises n said pulses.

12. The method of claim 10, comprising:
in the digital processing unit, comparing the updated accumulation value for each memristive device with a predetermined threshold dependent on a step-size $\varepsilon$ indicative of weight-change of the device in response to application of a predetermined programming pulse; and
if the updated accumulation value for a device exceeds said threshold, applying a said programming pulse to that device as a said programming signal.

13. The method of claim 10, wherein said digital weight-correction values and said new digital accumulation values are calculated by the digital processing unit with at least 16-bit precision.

14. The method of claim 2, comprising, in the digital processing unit, implementing the neurons of a said layer in the forward propagation operation by applying an activation function to the digital signal values corresponding to said output signals obtained from the preceding neuron layer to produce the digital signal values corresponding to said input signals associated with those neurons.

15. The method of claim 3, comprising, in the backpropagation operation:
for the last layer of neurons in the forward propagation operation, calculating in the digital processing unit respective error values dependent on an expected output of the neural network and the digital signal values corresponding to said output signals obtained from the preceding neuron layer;
applying signals corresponding to the error values as said input signals associated with neurons in said last layer; and
for each subsequent neuron layer up to the penultimate neuron layer, calculating in the digital processing unit respective error values for neurons in that layer based on the digital signal values corresponding to said output signals obtained from the preceding neuron layer in the backpropagation operation and said output signals obtained from the preceding neuron layer in the forward propagation operation.

16. The method of claim 15, comprising storing, in the digital processing unit, digital accumulation values for respective memristive devices and, in the digital processing unit in the weight-update operation:
calculating the digital weight-correction value $\Delta W$ for a memristive device corresponding to a synapse interconnecting a pair of neurons $n_1$ and $n_2$ as a function of said input signal received from neuron $n_1$ in the forward propagation operation and said error signal calculated for neuron $n_2$ in the backpropagation operation;

calculating updated accumulation values for respective memristive devices from the weight-correction value $\Delta W$ and stored accumulation value for each device, and determining a weight adjustment amount from the updated accumulation value for each device, wherein a said programming signal applied to a memristive device adjusts the stored weight $\hat{W}$ by an amount corresponding to the weight adjustment amount for that device; and calculating new digital accumulation values for respective devices by subtracting the weight adjustment amount from the updated accumulation value for each device.

17. An apparatus for implementing an artificial neural network having a succession of layers of neurons interposed with layers of synapses wherein each synapse interconnects a respective pair of neurons in successive neuron layers, the apparatus comprising:

a memcomputing unit comprising a set of crossbar arrays of memristive devices connected between row and column lines, each memristive device storing a weight $\hat{W}$ for a respective said synapse, and a controller for controlling application of signals to the memristive devices via said row and column lines, and a digital processing unit, operatively coupled to the memcomputing unit, adapted to control performance by the apparatus of forward propagation, backpropagation and weight-update operations of an iterative training scheme in which:

in at least one of the forward propagation and backpropagation operations of said scheme, said controller applies input signals, associated with respective neurons, to one of row and column lines of the set of arrays to obtain output signals on the other of said row and column lines;

the digital processing unit stores digital signal values corresponding to said input and output signals; and in the weight-update operation of said scheme, the digital processing unit calculates digital weight-correction values $\Delta W$, dependent on said digital signal values, for respective memristive devices, and said controller applies programming signals to those devices to update the stored weights $\hat{W}$ in dependence on the respective digital weight-correction values $\Delta W$.

18. The apparatus as claimed in claim 17, wherein said controller is adapted, in the forward propagation operation, to apply said input signals to row lines of the set of arrays to obtain output signals on the column lines, and, in the backpropagation operation, to apply said input signals to column lines of the set of arrays to obtain output signals on the row lines.

19. The apparatus as claimed in claim 18, wherein the digital processing unit is adapted to implement the neurons of a said layer in the forward propagation operation by applying an activation function to the digital signal values corresponding to said output signals obtained from the preceding neuron layer to produce the digital signal values corresponding to said input signals associated with those neurons.

20. The apparatus as claimed in claim 17, wherein:

the digital processing unit is adapted to round each weight-correction value $\Delta W$ with a predetermined stepsize $\varepsilon$ to produce a rounded correction value $\Delta \tilde{W}$; and the controller is adapted to apply a said programming signal to a memristive device to adjust the stored weight $\hat{W}$ by an amount dependent on the rounded correction value $\Delta \tilde{W}$ for that device.

21. The apparatus as claimed in claim 17, wherein:

the digital processing unit is adapted to store digital weight values corresponding to the weights $\hat{W}$ stored by respective memristive devices and, in the weight-update operation, to calculate new digital weight values for respective devices from the stored digital weight value and the digital weight-correction value $\Delta W$ for each device; and the apparatus is adapted such that the programming signal applied to a memristive device is dependent on the new digital weight value for that device.

22. The apparatus as claimed in claim 17, wherein:

the digital processing unit is adapted to store digital accumulation values for respective memristive devices;

in the weight-update operation, the digital processing unit is adapted to calculate updated accumulation values for respective memristive devices from the weight-correction value $\Delta W$ and stored accumulation value for each device, to determine a weight adjustment amount from the updated accumulation value for each device, and to calculate new digital accumulation values for respective devices by subtracting the weight adjustment amount from the updated accumulation value for each device; and the apparatus is adapted such that the programming signal applied to a memristive device adjusts the stored weight $\hat{W}$ by an amount corresponding to the weight adjustment amount for that device.

23. The apparatus as claimed in claim 22, wherein the digital processing unit is adapted to calculate said digital weight-correction values and said new digital accumulation values with at least 16-bit precision.

24. The apparatus as claimed in claim 17, wherein each memristive device comprises a plurality of memristive memory elements.

* * * * *